(12) United States Patent
Suzuki et al.

(10) Patent No.: US 6,946,711 B2
(45) Date of Patent: Sep. 20, 2005

(54) SEMICONDUCTOR DEVICE

(75) Inventors: Mikimasa Suzuki, Toyohashi (JP); Shoji Miura, Aichi-ken (JP); Akira Kuroyanagi, Okazaki (JP); Noriyuki Iwamori, Okazaki (JP); Takashi Suzuki, Aichi-ken (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/164,314

(22) Filed: Jun. 7, 2002

(65) Prior Publication Data

US 2003/0003692 A1 Jan. 2, 2003

(30) Foreign Application Priority Data

Jun. 7, 2001 (JP) ........................................ 2001-172761

(51) Int. Cl.$^7$ .............................................. H01L 29/76
(52) U.S. Cl. ...................... 257/376; 257/374; 257/375; 257/913
(58) Field of Search ................................ 257/374, 375, 257/376, 617, 913, 222, 329, 368, 369, 344, 334, 346, 408, 135, 327, 328, 133, 134, 324, 411, 77, 914; 438/758

(56) References Cited

U.S. PATENT DOCUMENTS

| | | | | |
|---|---|---|---|---|
| 5,256,582 A | * | 10/1993 | Mosher et al. | 438/206 |
| 6,180,473 B1 | * | 1/2001 | Hong et al. | 438/303 |
| 6,191,049 B1 | * | 2/2001 | Song | 438/758 |
| 6,362,510 B1 | * | 3/2002 | Gardner et al. | 257/374 |
| 6,410,409 B1 | * | 6/2002 | Gardner et al. | 438/526 |
| 6,410,938 B1 | * | 6/2002 | Xiang | 257/49 |
| 6,465,844 B2 | * | 10/2002 | Saito et al. | 257/336 |
| 6,734,520 B2 | * | 5/2004 | Kapels et al. | 257/483 |
| 2001/0020722 A1 | * | 9/2001 | Yang | 257/347 |
| 2002/0022348 A1 | * | 2/2002 | Sakaguchi et al. | 438/480 |

FOREIGN PATENT DOCUMENTS

| | | |
|---|---|---|
| JP | 2-260428 | 10/1990 |
| JP | 10-189609 | 7/1998 |
| JP | 2001-358146 | 12/2001 |

* cited by examiner

Primary Examiner—Minhloan Tran
Assistant Examiner—Tan Tran
(74) Attorney, Agent, or Firm—Posz Law Group, PLC

(57) ABSTRACT

In a semiconductor device such as MOSFET, a single crystal semiconductor substrate is provided. An epitaxitial layer is formed on the single crystal semiconductor substrate. A p-well regions are formed on the epitaxitial layer, respectively, and n$^+$ source regions are formed on the p-well regions, respectively. A gate electrode is formed through a gate insulation film on a part of each p-well region and that of each n$^+$ source region. The gate electrode is covered with an insulation film. On the insulation film, a source electrode is formed so that the n-channel MOSFET includes body diodes BD imbedded therein. A drain electrode is formed on the single crystal semiconductor substrate. A cluster-containing layer is implanted in the single crystal semiconductor substrate as a gettering layer so that the cluster-containing layer contains a cluster of nitrogen.

10 Claims, 15 Drawing Sheets

US 6,946,711 B2

SEMICONDUCTOR DEVICE

BACKGROUND OF THE INVENTION

1. Field of the Invention

The present invention relates to a semiconductor device and a method of manufacturing the same.

2. Description of the Related Art

Conventional processes aiming at gettering effects include intrinsic gettering (hereinafter, referred to "IG") which uses oxygen precipitate defects 100 in a semiconductor substrate 101 of a semiconductor device, for example, an n-channel vertical MOSFET, as shown in FIG. 30. The oxygen precipitate defects 100 are served as a gettering layer which can getter defects in an element formation region 102.

In the IG, in order to improve the gettering effects to make better the quality of gate film of the semiconductor device and the reliabilities of elements formed therein, it is necessary to increase the oxygen concentration in the semiconductor substrate.

This method, however, as shown in FIG. 31, causes the resistance rate of the substrate to increase with the growth of the oxygen concentration of the substrate. This increase of the resistance rate makes increase the on-resistance of the vertical power semiconductor device, the substrate of which is served as a current path, causing the loss of the device to be increased.

SUMMARY OF THE INVENTION

The present invention is made on the background of the foregoing circumstances. Accordingly, it is an object of the present invention to provided a semiconductor device and a method of the same, semiconductor device which has an element formation region containing few defects and high performance.

In order to achieve such object, according to one aspect of the present invention, there is provided a semiconductor substrate on which an element is formed; and a cluster-containing layer implanted in the semiconductor substrate as a gettering layer, the cluster-containing layer containing a cluster of nitrogen.

In preferred embodiment of this one aspect, the semiconductor substrate has a single crystal semiconductor substrate member and an epitaxitial layer formed thereon, the cluster-containing layer being implanted in the epitaxitial layer.

In preferred embodiment of this one aspect, the cluster of nitrogen corresponds to doses of nitrogen ions, the doses of nitrogen ions are within the range substantially from $1 \times 10^{14}$ cm$^{-2}$ to $1 \times 10^{15}$ cm$^{-2}$.

In order to achieve such object, according to another aspect of the present invention, there is provided a method of manufacturing a semiconductor device comprising the steps of: preparing a semiconductor substrate with first and second surfaces; implanting nitrogen ions from one of the first and second surfaces of the semiconductor substrate therein; subjecting the semiconductor substrate to a thermal process so as to form a cluster-containing layer as a gettering layer in the semiconductor substrate at a predetermined depth direction thereof; and forming an element on/in the semiconductor substrate.

In order to achieve such object, according to further aspect of the present invention, there is provided a method of manufacturing a semiconductor device comprising the steps of: preparing a first semiconductor substrate; forming an insulating film on the first semiconductor substrate; implanting nitrogen ions from one surface of the insulating film into the first semiconductor substrate; subjecting the first semiconductor substrate to a thermal process so as to form a cluster-containing layer as a gettering layer in the first semiconductor substrate at a predetermined depth direction thereof; preparing a second semiconductor substrate; laminating the second semiconductor substrate through the insulating film on the first semiconductor substrate; and forming an element on/in the at least one of the first and second semiconductor substrates.

BRIEF DESCRIPTION OF THE DRAWINGS

Other objects and aspects of the present invention will become apparent from the following description of embodiments with reference to the accompanying drawings in which.

DETAILED DESCRIPTION OF THE PREFERRED EMBODIMENTS (First Embodiment)

A first embodiment substantially concretely representing the present invention will be described hereinafter with reference to the accompanying drawings.

Figure 1:
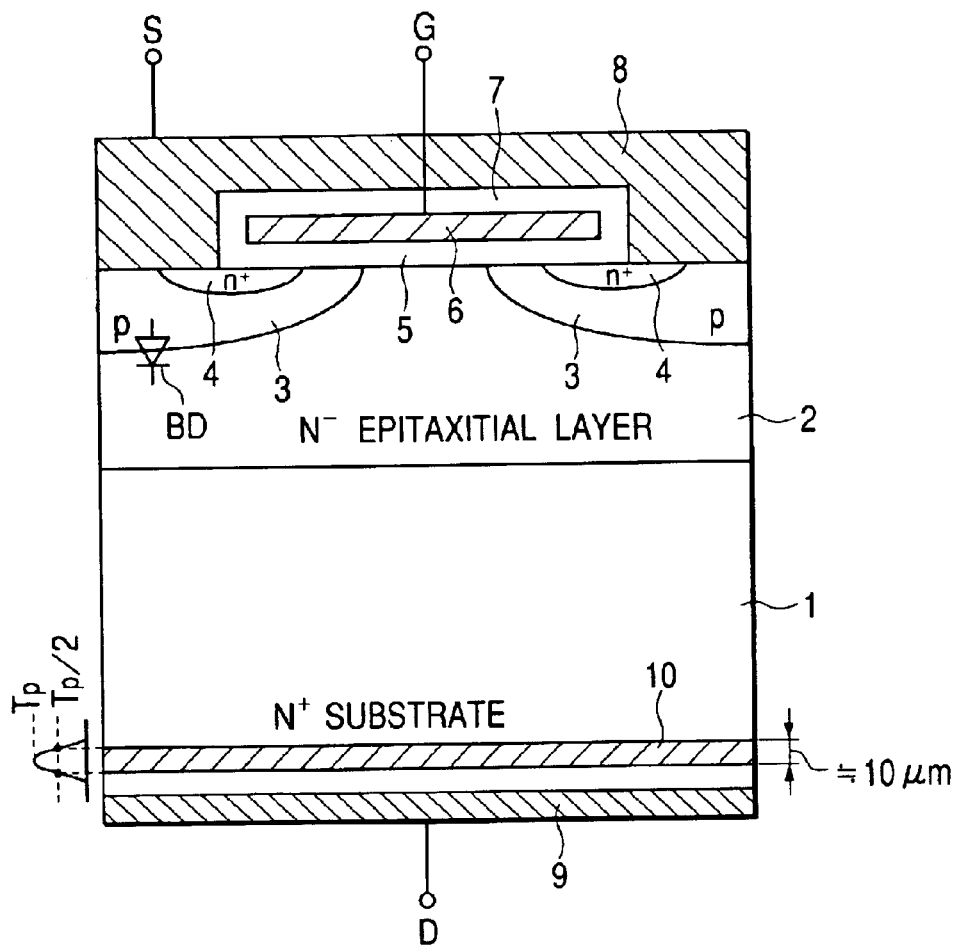
FIG. 1 is a vertical cross sectional view of an n-channel vertical MOSFET according to a first embodiment of the present invention.

FIG. 1 is a vertical cross sectional view of an n-channel vertical MOSFET (hereinafter, sometimes referred simply to "n-channel MOSFET") as an example of a semiconductor device according to the first embodiment. In the first embodiment, the n-channel MOSFET has a single crystal semiconductor substrate (wafer) 1 made of Silicon (Si) and an epitaxial layer 2, that is a drain region, is formed on a first surface (upper surface in FIG. 1 for example) of the single crystal semiconductor substrate 1.

In addition, the single crystal semiconductor substrate 1 is formed by Czochralski (CZ) method so that the single crystal semiconductor substrate 1 is also called as "CZ substrate".

The CZ substrate 1 includes $n^+$ dopant doped therein so that the substrate 1 is also called as "$n^+$-type substrate".

The n-channel MOSFET includes p-well regions (p-base regions) 3 formed on a first surface portion of the epitaxial layer 2, respectively, and $n^+$ source regions 4 formed on the p-well regions 3, respectively, first surface portion which is opposite to a second surface portion adjacent to the first surface of the substrate 1.

A gate electrode 6 with a terminal shown as "G" is formed through a gate insulation film 5 on a part of each p-well region 3 and that of each $n^+$ source region 4. The gate electrode 6 is covered with an insulation film 7. On the insulation film 7, a source electrode 8 whose terminal is shown as "S" is formed so that the n-channel MOSFET includes body diodes BD imbedded therein. A drain electrode 9 with a terminal shown as "D" is formed on a second surface (back surface in FIG. 1 for example) of the single crystal semiconductor substrate 1.

The n-channel MOSFET is provided with a cluster-containing layer 10 containing a cluster of nitrogen, which is implanted in the second surface side of the single crystal semiconductor substrate 1.

The cluster-containing layer 10 has a concentration $T_P$ whose half width $T_P/2$ is approximately 10 μm in a depth direction of the substrate 1, and is locally arranged in the depth direction as a gettering layer so as to be close to the drain region 9 at a predetermined depth position of the substrate 1.

The cluster-containing layer 10 operates as a gettering layer. That is, the cluster-containing layer 10 permits defects to be removed, defects which exist in the gate insulation film 5 or the interface of the gate insulation film 5 with respect to the epitaxitial layer 2, making it possible to improve the dielectric breakdown voltage of the gate.

In addition, the cluster-containing layer 10 permits defects in the epitaxial layer 2 to be removed, thereby reducing junction leak current in the p-well regions 3 or the $n^+$ source regions 4. This allows the manufacturing yield of the semiconductor device to be improved and the n-channel MOSFET (semiconductor device) with high reliability to be manufactured.

Next, manufacturing method of the n-channel MOSFET according to the first embodiment will be described hereinafter with reference to FIG. 2 to FIG. 4.

First, the single crystal semiconductor substrate ($n^+$-type substrate) 1 is prepared and nitrogen ions (N ions) are implanted in the substrate 1 from the second surface thereof. The implanted nitrogen ions cause a crystal defect layer 15 to be formed in the second surface side of the substrate 1. The substrate 1 including the crystal defect layer 15 is subjected to an annealing process (a thermal process) so that, as shown in FIG. 3, the cluster-containing layer 10 containing a cluster of nitrogen (nitrogen atoms/nitrogen molecule) is formed as a gettering layer in the second surface side of the substrate 1 at a predetermined depth position thereof.

Figure 4:
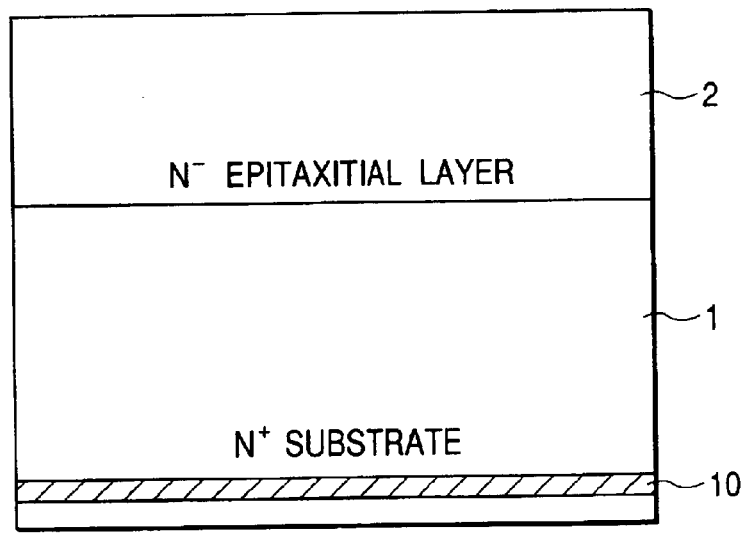
FIG. 4 is a vertical cross sectional view for explaining a manufacturing process of the n-channel vertical MOSFET according to the first embodiment of the present invention.

After the gettering layer forming process, as shown in FIG. 4, the single crystal substrate 1 is subjected to an epitaxy process (epitaxial growth process) so that the $n^-$ epitaxial layer 2 which is the drain region is formed on the first surface of the single crystal substrate 1, which is opposite to the second surface and corresponds to the upper surface of the substrate shown in FIG. 1.

After the epitaxial layer forming step, elements (devices), for example, the gate electrode 6, the source electrode 8 and so on, are formed on/in the epitaxitial layer 2 by using DMOS (Double-Diffused MOS) manufacturing technique, as shown in FIG. 1.

That is, the gate electrode 6 is formed through the gate insulation film 5 on the first surface (upper surface) of the n⁻ epitaxitial layer 2. The n⁻ epitaxitial layer 2 is subjected to a double-diffusion process with the gate electrode 6 as a mask, causing the p-well regions 3 and the n⁺ source regions 4 to be formed on the first surface portion of the n⁻ epitaxitial layer 2, thereby forming double body diodes BD within the substrate 1.

Furthermore, the gate electrode 6 is coated with the insulating film 7 and the source electrode 8 is formed on the insulating film 7. The drain electrode 9 is formed on the second surface of the substrate 1.

Figure 5:
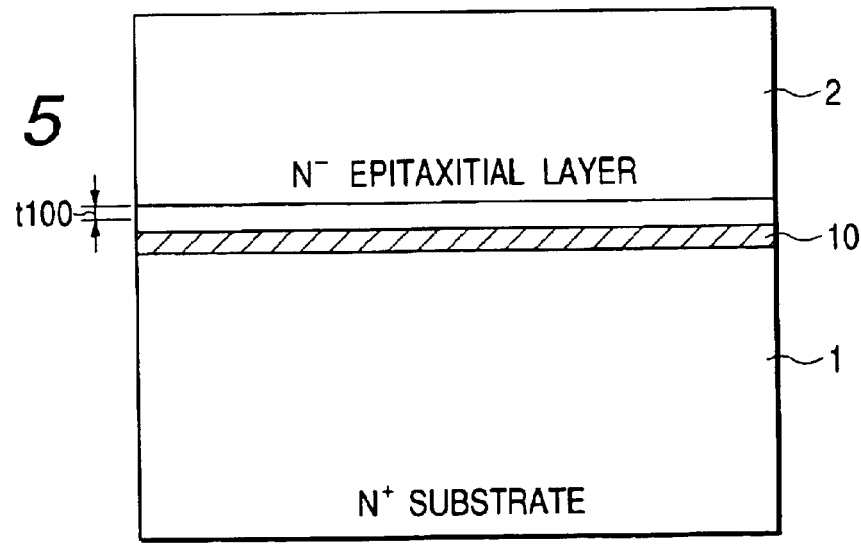
FIG. 5 is a vertical cross sectional view for explaining another manufacturing process of the n-channel vertical MOSFET according to the first embodiment of the present invention.

Incidentally, in FIG. 1, the n-channel MOSFET is disclosed as an example of the present invention, but the present invention is not limited to the above structure. That is, whichever an n-type single crystal semiconductor substrate and a p-type single crystal semiconductor substrate may be used to realize the present invention, and whichever an n-type epitaxial layer and a p-type epitaxial layer may be applied as the epitaxitial layer 2 in FIG. 1. In addition, as shown in FIG. 5, the epitaxitial layer 2 may be formed on the first surface of the single crystal semiconductor substrate 1, from which the nitrogen ions are implanted. That is, in the first embodiment, the epitaxitial layer 2 may be formed on one of the first and second surfaces of the substrate 1, and the elements may be formed on the epitaxitial layer 2.

Figure 6:
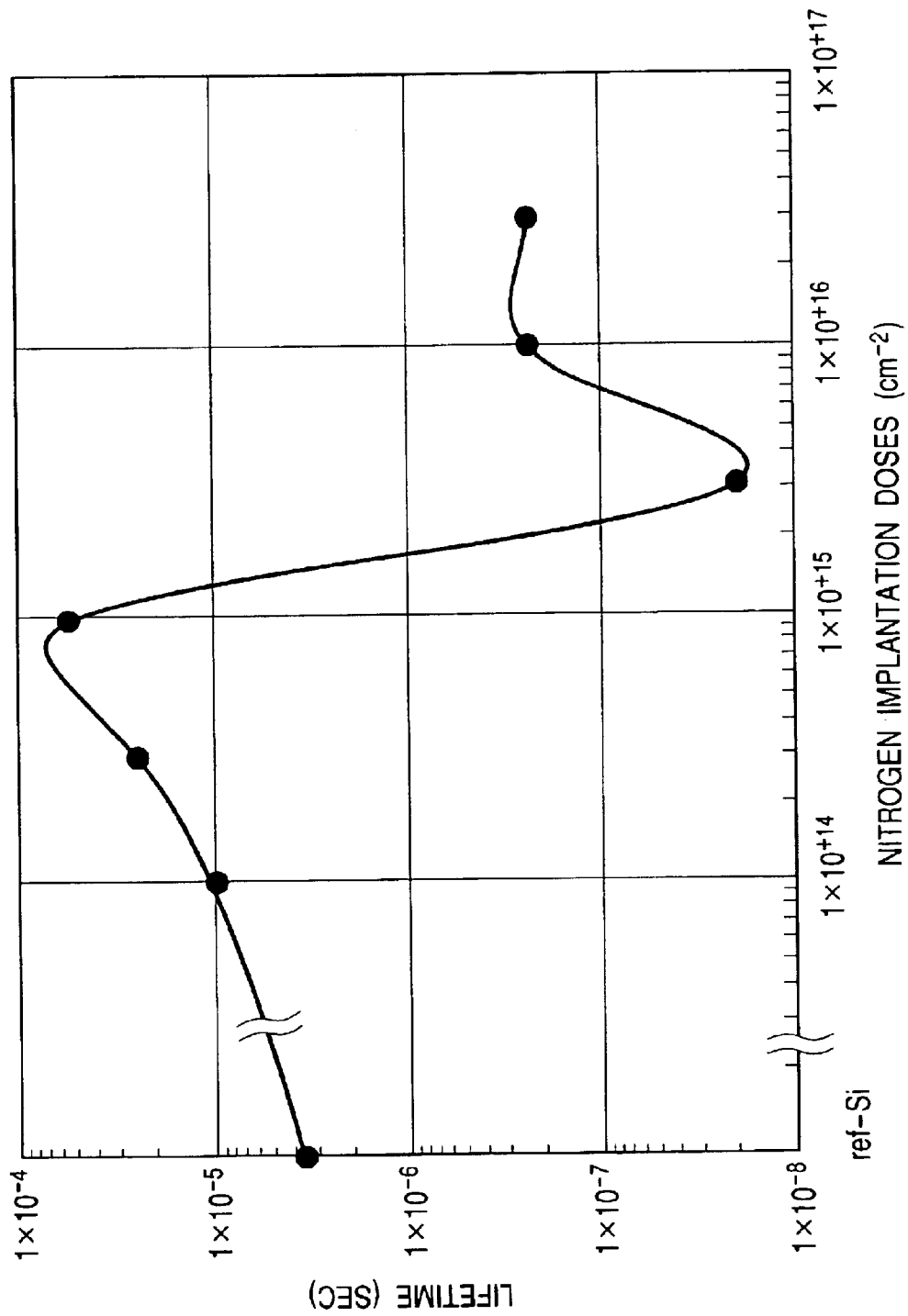
FIG. 6 is a view showing a result of a test representing a correlation between doses of nitrogen ions implanted into a substrate of a first sample of the MOSFET and a lifetime of the substrate.
Figure 7:
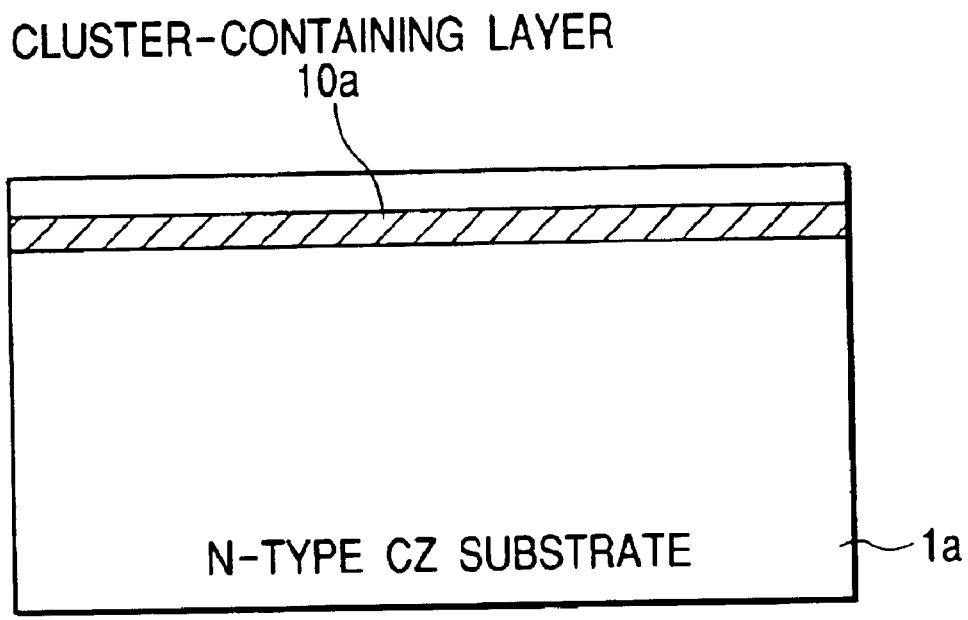
FIG. 7 is a view showing the first sample of the MOSFET according to the first embodiment.

FIG. 6 showed the result of the test showing a correlation between doses of the nitrogen ions implanted into the single crystal semiconductor substrate (n-type CZ substrate) 1a and the lifetime thereof. The n-type CZ substrate 1a, as shown in FIG. 7, was prepared as the substrate 1 of a first sample of the n-channel MOSFET according to the first embodiment.

In FIG. 6, the horizontal axis represented the nitrogen implantation doses (cm⁻²) implanted in the n-type CZ substrate 1a and the vertical axis represented the lifetime (sec) of the n-type CZ substrate 1a. In addition, the lifetime data of a reference substrate in which no nitrogen ions are implanted was shown as "ref-Si".

FIG. 6 represented that the lifetime was long with an increase of the implanted doses. In addition, FIG. 6 represented that, when the implanted doses were substantially over $1\times10^{15}$ cm⁻², the lifetime decreased, and when the implanted doses were more increased, the decrease of the lifetime was stopped so that the lifetime was increased to be recovered.

This test result made clear that, in view of improving the recovery characteristic of the body diodes BD referred to FIG. 1, that is, shortening the lifetime of the substrate 1 (1a), it was preferable to make large the implanted doses of the nitrogen ions over $1\times10^{15}$ cm⁻². Incidentally, the improvement of the recovery characteristic of the body diode BD will be explained in detail in a third embodiment.

Figure 8:
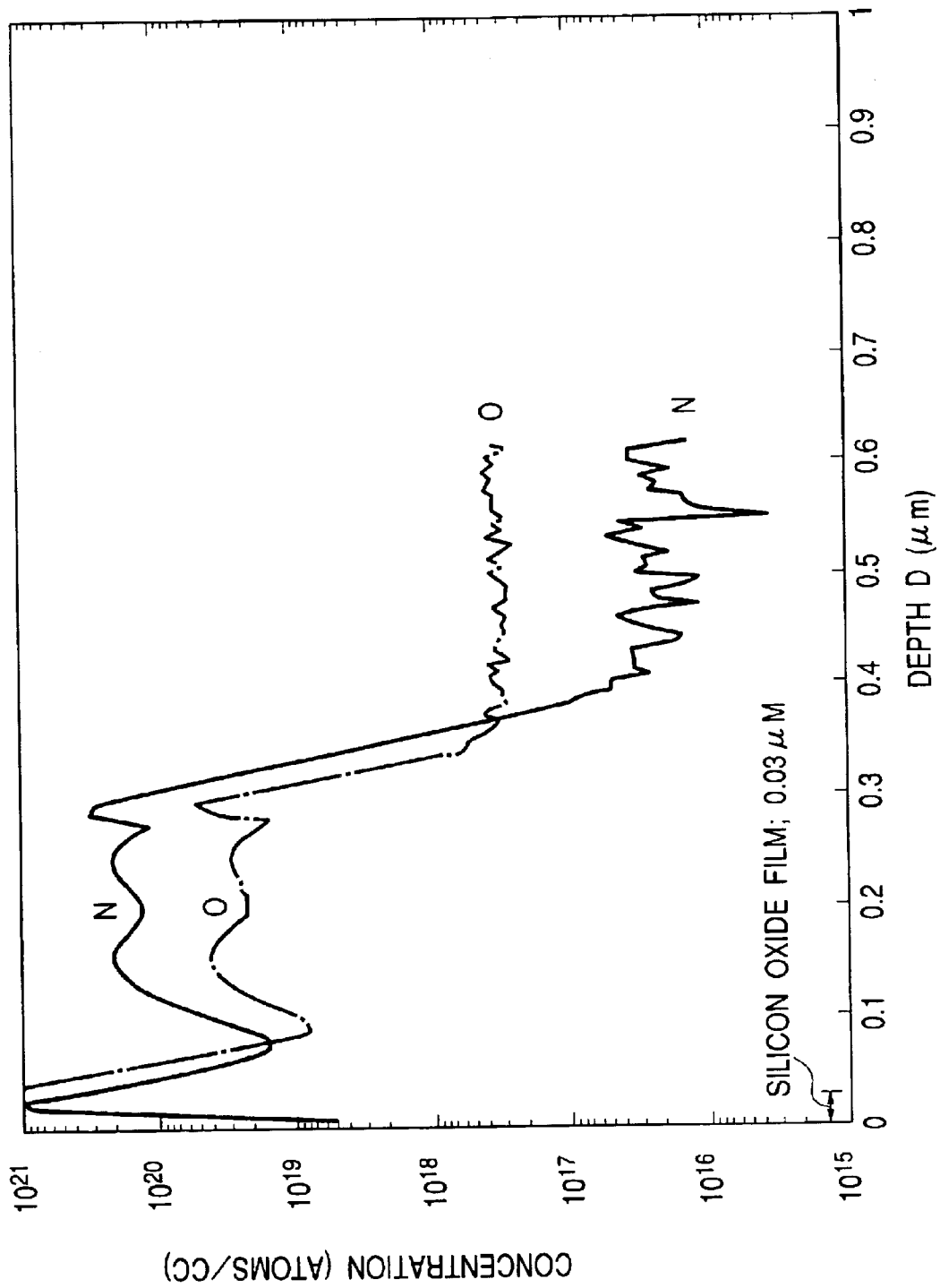
FIG. 8 is a view showing a concentration profile between nitrogen atoms and oxygen atoms in a substrate of a second sample according to the first embodiment.
Figure 9:
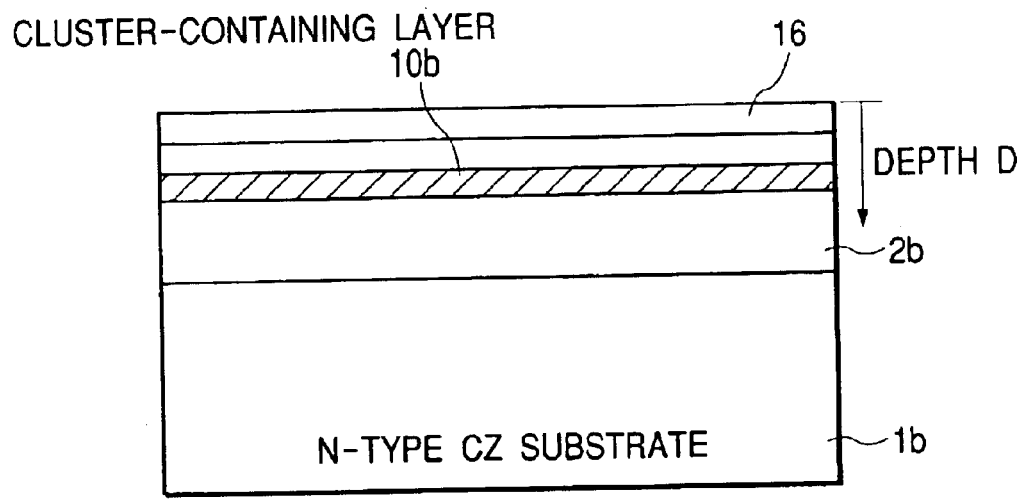
FIG. 9 is a view showing the second sample of the MOSFET according to the first embodiment.

FIG. 8 showed the result of the SIMS (Secondary Ion Mass Spectrometry) analysis which was applied to a second sample of the n-channel MOSFET according to the first embodiment. That is, as shown in FIG. 9, the n-type CZ substrate 1b was prepared as the substrate 1 of the second sample of the MOSFET. The epitaxitial layer 2b was formed on the n-type CZ substrate 1b. In particular, the second sample was provided with a silicon oxide film (SiO₂) 16 formed in the epitaxitial layer 2b, which had approximately 0.03 μm in thickness in the depth direction of the substrate 1b.

The nitrogen ions with doses of $1\times10^{16}$ cm⁻² were implanted from the silicon oxide film 16 in the n-type CZ substrate 1b so that the cluster-containing layer 10b was formed therein. After the implantation process, the second sample was subjected to an anneal process at 1170° C. for 60 minutes. The ion implantation through the silicon oxide film 16 could prevent the implanted nitrogen ions from being damaged by the epitaxitial layer 2b.

After the annealing process, the SIMS analysis was applied to the second sample so that the result of the SIMS analysis was obtained, as shown in FIG. 8.

In FIG. 8, the horizontal axis represented the depth D (μm) from an upper surface of the silicon oxide film 16, and the vertical axis represented the concentration (atoms/cc) of the implanted ions.

The epitaxitial layer 2b originally allowed oxide atoms to exist therein, which were no more than the detection limit value already determined on the basis of the SIMS analysis. In the FIG. 8, however, the oxide atoms existed so that the profile of the concentration of the oxide atoms was substantially the same as that of the concentration of the nitrogen atoms. This meant that the oxide atoms were trapped in the cluster-containing layer 10b.

As described above, according to the n-channel MOSFET of the first embodiment, the cluster-containing layer 10 (10a, 10b) containing a cluster of nitrogen enables to obtain the effects of removing contaminated defects in the epitaxitial layer 2 (2a, 2b) including an element formation region, making it possible to provide the n-channel MOSFET with high performance. That is, as described in the related art, using the conventional IG so as to increase the oxide concentration in the substrate causes the on-resistance to be increased. In the first embodiment, however, it is possible to improve the quality of gate film of the n-channel MOSFET and the reliability thereof without increasing the on-resistance of the n-channel MOSFET.

(Second Embodiment)

Next, a second embodiment of the present invention will be explained hereinafter with a focus on the different points of this embodiment from the first embodiment so that the expressions of the elements of the second embodiment which are the same as those of the first embodiment are omitted or simplified.

As compared with the first embodiment, the second embodiment discloses a semiconductor device, which has no epitaxial layer, with a single crystal semiconductor substrate (wafer). The semiconductor device of the second embodiment is designed to make longer the lifetime of the single crystal semiconductor substrate so that the lifetime substantially equals to that of the epitaxial layer on the basis of the effects of removing defects in the substrate by a cluster-containing layer containing a cluster of nitrogen, thereby improving yields of elements (devices) formed in the single crystal semiconductor substrate and high reliabilities thereof.

Figure 10:
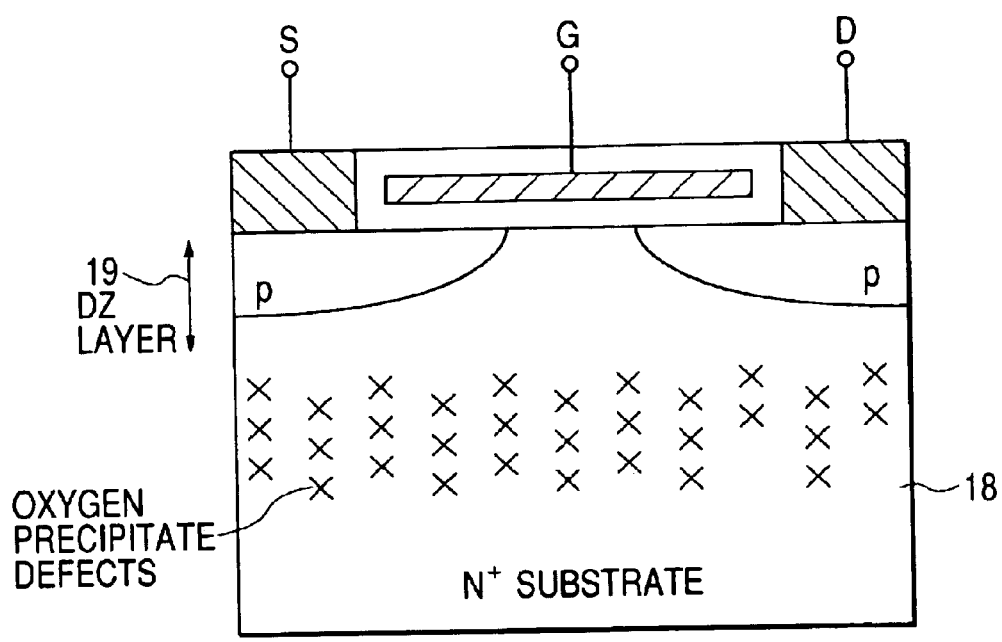
FIG. 10 is a vertical cross sectional view of a p-channel vertical MOSFET.

As related processes of aiming at the gettering effects, as shown in FIG. 10, the IG is known, which uses oxygen precipitate defects 17 in a semiconductor substrate 18 of a semiconductor device. The oxygen precipitate defects 19 are served as a gettering layer which can getter impurities in the substrate 18.

The IG needs to add a special thermal process to the substrate for forming a denuded zone (DZ) which is a defect-free zone therein. In cases where the effects obtained by the IG are insufficient, the epitaxial layer must be formed on the surface of the substrate. However, many processes must be required for forming the epitaxitial layer so that there is the possibility that using the epitaxial wafer (Epi Wafer) which includes the epitaxial layer causes the cost of manufacturing the semiconductor device to be increased.

Then, in this embodiment, the structure of the semiconductor device described hereinafter is used on the focus of the cluster-containing layer containing a cluster of nitrogen, which includes the gettering effects.

Figure 11:
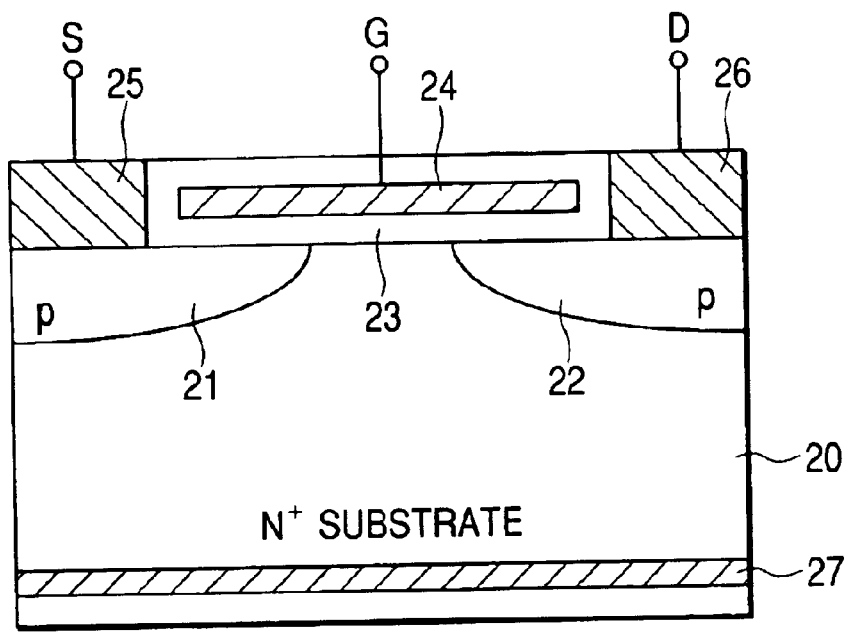
FIG. 11 is a vertical cross sectional view of an n-channel vertical MOSFET according to a second embodiment of the present invention.

FIG. 11 shows a vertical cross sectional view of a p-channel vertical MOSFET (p-channel MOSFET) as an example of a semiconductor device according to the second embodiment. The p-channel MOSFET has a single crystal semiconductor substrate (CZ substrate) 20 including n dopant doped therein so that the substrate 20 is also called as "n-type substrate 20".

In a first surface side (upper surface side) of the substrate 20, a p-source region 21, a p-drain region 22, a gate insulating film 23, a gate electrode 24, a source electrode 25 and a drain electrode 26 are formed, respectively.

Inside a second surface side (back surface side) of the single crystal semiconductor substrate 20, a cluster-containing layer 27 containing a cluster of nitrogen is implanted so as to be locally arranged in the depth direction as a gettering layer at a predetermined depth position of the substrate 20.

The cluster-containing layer 27 has effects of gettering defects which exist in the gate insulation film 23 or the interface of the gate insulation film 23 with respect to the substrate 20, making it possible to improve the dielectric breakdown voltage of the gate.

The cluster-containing layer 27 permits defects in the substrate 20 to be gettered, thereby reducing junction leak current in the source regions 21 or the drain regions 22. This allows the manufacturing yield of the semiconductor device (p-channel MOSFET) to be improved and the semiconductor device with high reliability to be manufactured.

Next, manufacturing method of the p-channel MOSFET according to the second embodiment will be described hereinafter with reference to FIG. 12 to FIG. 13.

Figure 12:
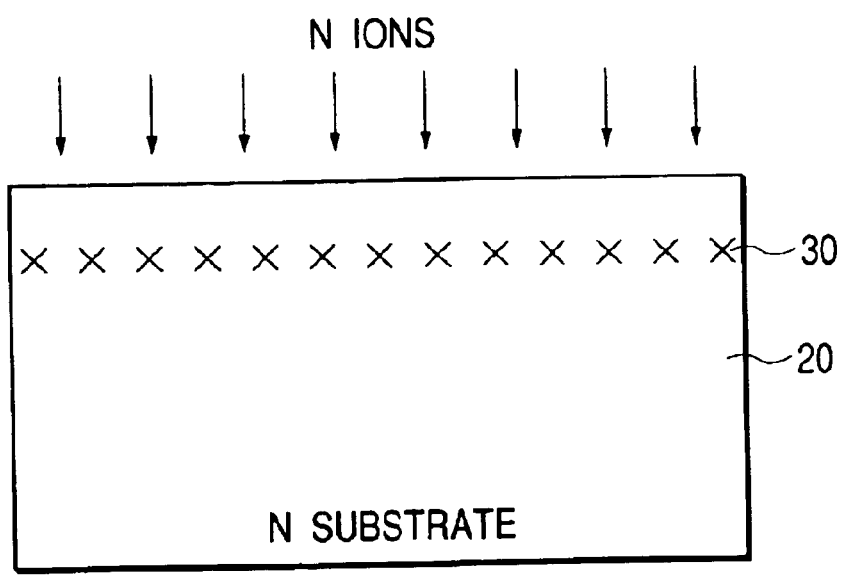
FIG. 12 is a vertical cross sectional view for explaining a manufacturing process of the n-channel vertical MOSFET according to the second embodiment of the present invention.

First, the single crystal semiconductor substrate (n single crystal semiconductor substrate) 20 is prepared and nitrogen ions (N ions) are implanted in the substrate 20 from the second surface thereof, which corresponds to an upper side of the substrate 20 shown in FIG. 12. At that time, the implanted doses of the nitrogen ions are within the range substantially from $1 \times 10^{14}$ cm$^{-2}$ to $1 \times 10^{15}$ cm$^{-2}$.

The implanted nitrogen ions cause a crystal defect layer 30 to be formed in the second surface side of the substrate 20 close to the second surface thereof. The substrate 20 including the crystal defect layer 30 is subjected to an annealing process so that, as shown in FIG. 13, the cluster-containing layer 27 containing a cluster of nitrogen is formed as a gettering layer in the second surface side of the substrate 20 at a predetermined depth position thereof.

After the gettering layer forming process, elements, for example, the gate electrode 24, the source electrode 25 and so on, are formed on/in the first surface (upper surface) side of the single crystal substrate 20 by using a manufacturing process for usual semiconductor elements, thereby to obtain the semiconductor device shown in FIG. 11.

Figure 14:
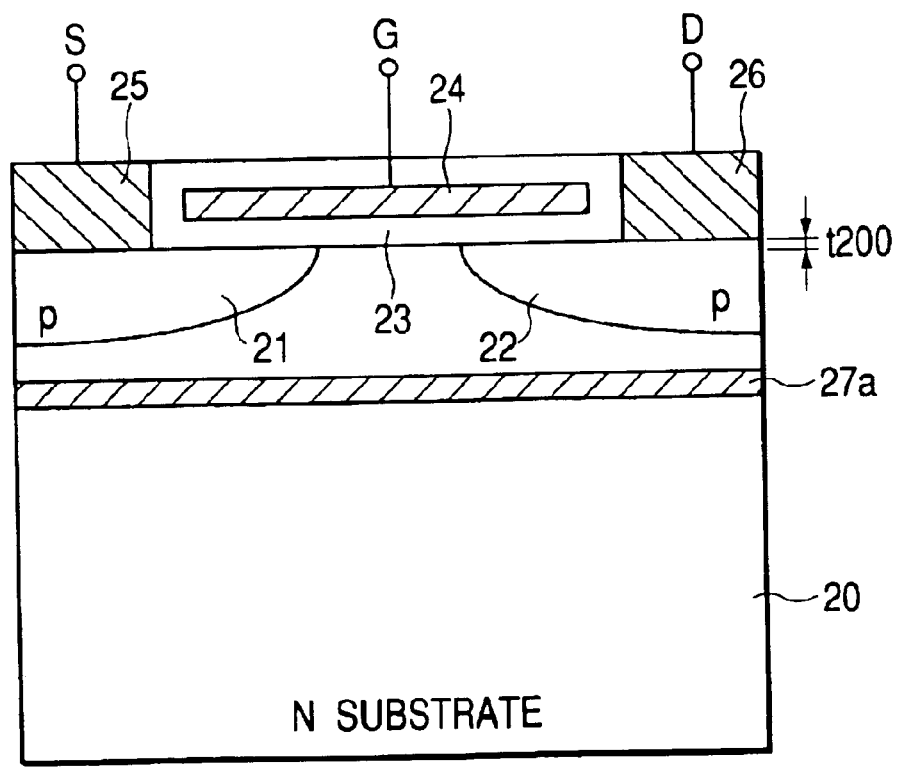
FIG. 14 is a vertical cross sectional view of another example of n-channel vertical MOSFET according to a modification of the second embodiment of the present invention.

In addition, in FIG. 11, the p-channel vertical MOSFET is disclosed as an example of the present invention, but the present invention is not limited to the above structure. That is, either an n-type single crystal semiconductor substrate or a p-type single crystal semiconductor substrate may be used to realize the present invention. Moreover, as shown in FIG. 14, the cluster-containing layer 27 may be formed in the second surface side of the substrate 20 at another predetermined depth position thereof, which is deeper than the element formation region in the second surface side, so that the elements may be formed on/in the second surface side of the substrate 20, from which the ions are implanted.

Furthermore, in the second embodiment, the present invention is applied to the MOSFET, but the present invention is not limited to the application. That is, the present invention may be applied to a bipolar device, a diode, an IGBT (Insulated Gate Bipolar Transistor) or other similar devices.

Figure 15:
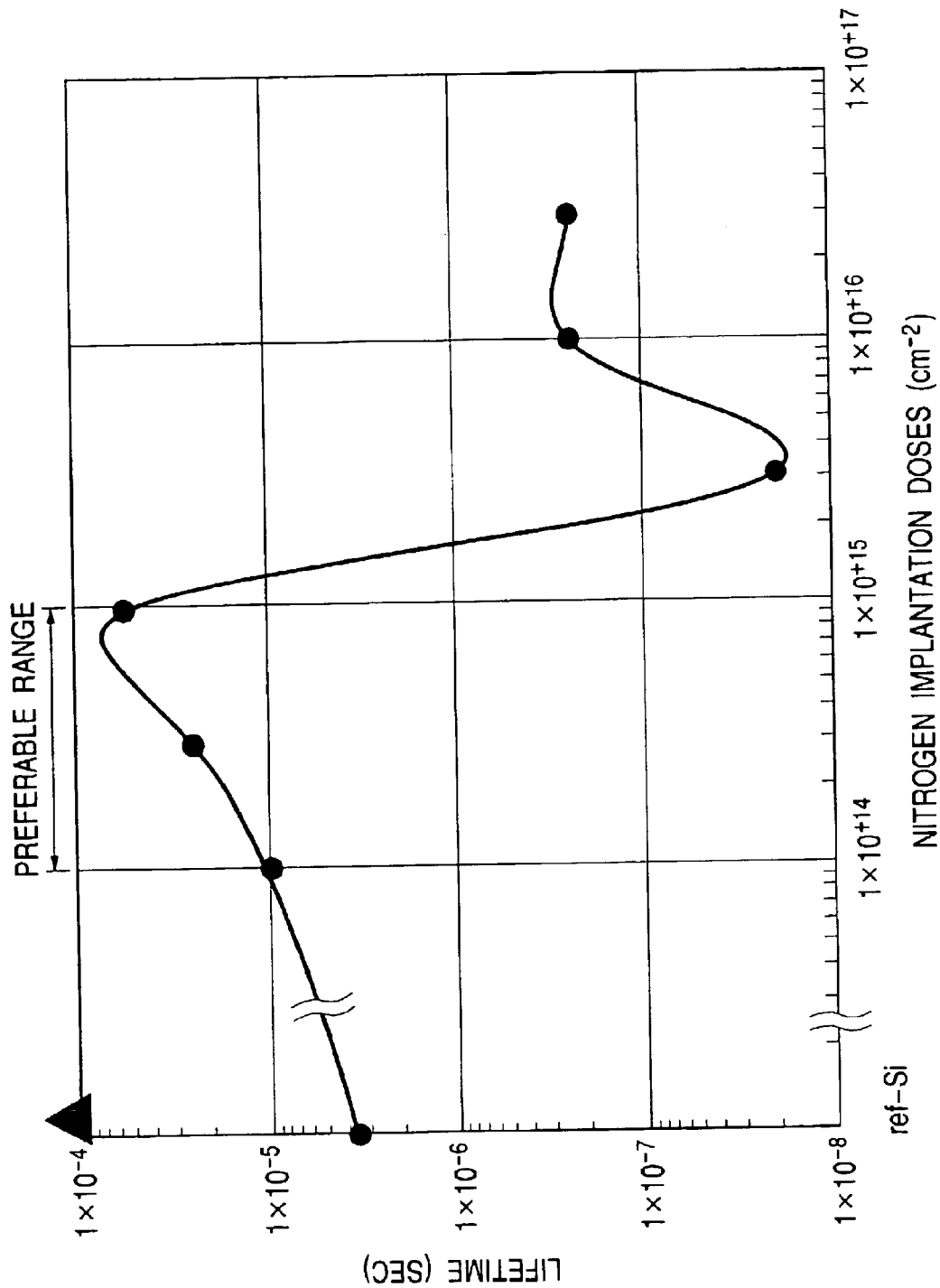
FIG. 15 is a view showing a result of examination, that is, a correlation between dosages and life times of nitrogen ions implanted into a substrate of the n-channel vertical MOSFET according to the second embodiment.

FIG. 15 showed the result of the test showing a correlation between doses of the nitrogen ions implanted into the single crystal semiconductor substrate (CZ substrate) 20a and the lifetime thereof.

Figure 16:
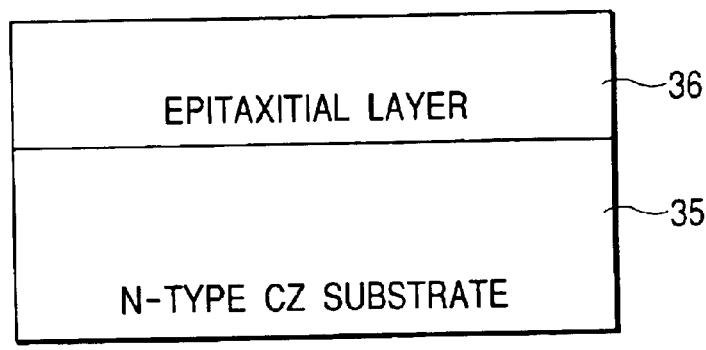
FIG. 16 is a view showing a sample of the substrate according to the second embodiment.

In FIG. 15, the horizontal axis represented the nitrogen implantation doses (cm$^{-2}$) implanted in the CZ substrate 20a and the vertical axis represented the lifetime (sec) of the CZ substrate 20a. In addition, the lifetime data of a reference substrate in which no nitrogen ions were implanted was shown as "ref-Si". Moreover, as shown in FIG. 16, the data representing a correlation between doses of the nitrogen ions implanted into a CZ substrate 35 on which an epitaxitial layer 36 was formed and the lifetime data of the CZ substrate 35 was shown as a plot point "▲".

FIG. 15 represented that the longer the lifetime was, the more increasing the implanted doses were. In addition, FIG. 15 represented that, when the implanted doses were substantially over $1 \times 10^{15}$ cm$^{-2}$, the lifetime decreased. Then in cases where the implanted doses of the nitrogen ions were within the range from substantially $1 \times 10^{14}$ cm$^{-2}$ to substantially $1 \times 10^{15}$ cm$^{-2}$, it was possible to make long the lifetime of the CZ substrate 20a, lifetime which was substantially close to that of the CZ substrate 35 on which the epitaxitial layer 36 was formed, which was shown as "▲".

Therefore, setting, when implanting the nitrogen ions, the doses of the nitrogen ions within the range from substantially $1 \times 10^{14}$ cm$^{-2}$ to substantially $1 \times 10^{15}$ cm$^{-2}$ allowed the lifetime of the CZ substrate having no epitaxial layer to be increased so that the lifetime thereof substantially equaled to that of the CZ substrate with the epitaxial layer, making it possible to improve yields of elements (devices) formed in the CZ substrate (semiconductor substrate) and high reliabilities thereof. That is, as shown in FIG. 15, the lifetime of the CZ substrate without the epitaxial layer was more improved than the lifetime "ref-Si" of the reference substrate in which no nitrogen ions are implanted. Therefore, it was possible to provide a semiconductor substrate having a long lifetime even when not using the epitaxial layer.

As described above, as a problem of the gettering technique (IG), when using the epitaxial layer, many processes must be required for forming the epitaxial layer and the use of the epitaxial wafer causes the cost of manufacturing the semiconductor device to be increased.

However, in the second embodiment, implanting the nitrogen ions in the substrate having no epitaxial layer permits the lifetime of the substrate to be increased. In particular, when the implanted doses of the nitrogen ions are within the range (preferable range) from substantially $1 \times 10^{14}$ cm$^{-2}$ to substantially $1 \times 10^{15}$ cm$^{-2}$, it is possible to make long the lifetime of the CZ substrate having no epitaxitial layer so that the lifetime of the CZ substrate substantially equals to the same level of the CZ substrate with the epitaxitial layer.

Figure 2:
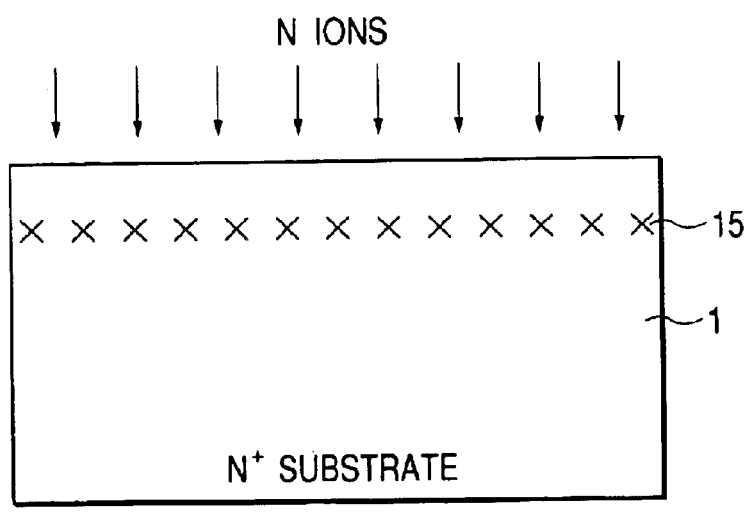
FIG. 2 is a vertical cross sectional view for explaining a manufacturing process of the n-channel vertical MOSFET according to the first embodiment of the present invention.
Figure 3:
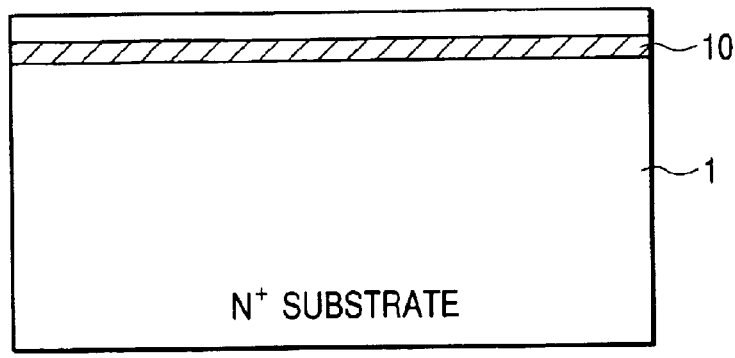
FIG. 3 is a vertical cross sectional view for explaining a manufacturing process of the n-channel vertical MOSFET according to the first embodiment of the present invention.

Incidentally, the doses of the nitrogen atoms according to the first embodiment, when executing the ion implanting process shown in FIG. 2, may be set to those of the nitrogen atoms according to this embodiment, which are within the range from substantially $1 \times 10^{14}$ cm$^{-2}$ to substantially $1 \times 10^{15}$ cm$^{-2}$.

(Third Embodiment)

Next, a third embodiment of the present invention will be explained hereinafter with a focus on the different points of this embodiment from the first embodiment so that the expressions of the elements of the third embodiment which are the same as those of the first embodiment are omitted or simplified.

Figure 17:
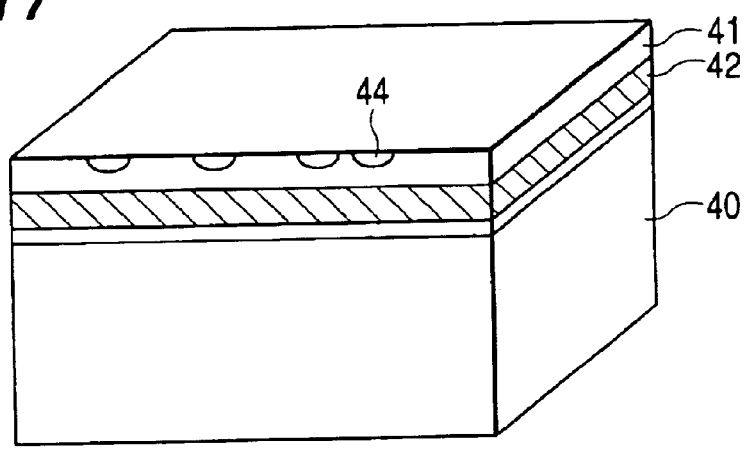
FIG. 17 is a perspective view for explaining a manufacturing process of an n-channel vertical MOSFET according to a third embodiment of the present invention.
Figure 19:
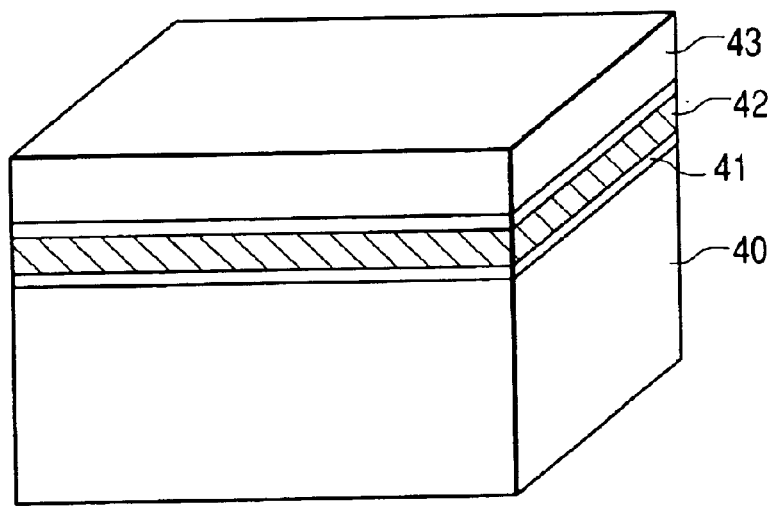
FIG. 19 is a perspective view for explaining a manufacturing process of the n-channel vertical MOSFET according to the third embodiment.

This embodiment, as shown in FIG. 17, discloses a DMOS device as an example of a semiconductor device. The DMOS device is provided with a single crystal semiconductor substrate 40 made of Silicon (Si) and a first epitaxial layer 41 formed thereon. The DMOS device also has a cluster-containing layer 42 containing a cluster of nitrogen formed in the substrate 40. The DMOS device is further provided with a second epitaxial layer 43 formed on the cluster-containing layer 42, as shown in FIG. 19.

Figure 18:
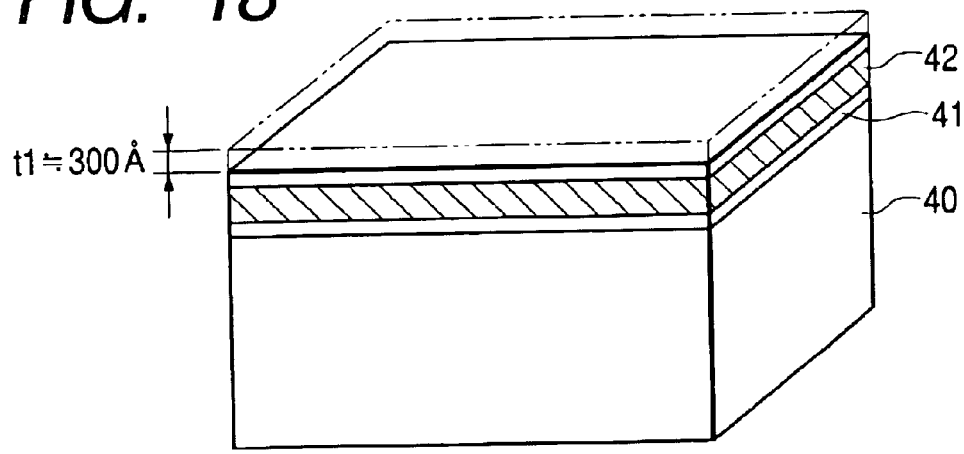
FIG. 18 is a perspective view for explaining a manufacturing process of the n-channel vertical MOSFET according to the third embodiment.

Before making grow the second epitaxial layer 43 on the substrate 40 by implanting nitrogen ions in the substrate 40, an etching process is additionally applied to the epitaxial layer 41 so that the silicon of only approximately 300 Å (angstroms), referred to as "t1" in FIG. 18, is etched away from the wafer surface of the epitaxial layer (epi wafer) 41. The etching process allows the second epitaxial layer 43 having few crystal defects to be realized without vanishing the cluster-containing layer 42.

Hereinafter, the characteristics of the third embodiment will be explained in detail.

A DMOS element (device) with the rated breakdown voltage of approximately 60~200 volts, as shown in FIG. 1, is formed on the wafer having the n$^+$ substrate on which the n epitaxial layer (drift layer) 2 with approximately 6~17 μm in layer thickness (film thickness) is formed. The reason of employing the structure is that the device breakdown voltage (BVdss) of the DMOS device is determined according to the film thickness of the n$^-$ epitaxial layer 2. When using the DMOS device for an inverter, the body diodes contained in the DMOS device are used as free wheeling diodes, because of reducing the cost of the inverter as compared with an inverter using private free wheeling diodes (external diodes).

However, the body diode contained in the device has usually low recovery characteristic (reverse recovery characteristic), thereby causing a high recovery surge voltage and oscillation phenomenon (called as "ringing phenomenon"). These recovery surge voltage and the oscillation phenomenon cause the breakdown of the device and/or noises so that there is the possibility that it is hard to obtain the performance of the DMOS device required as a product. In order to prevent this problem, reducing the switching rate by, for example, adjusting the gate resistance may be employed for the DMOS device so as to control the surge voltage. In addition, in order to prevent this problem, adding a snubber circuit or the like may be employed for the DMOS so as to control the serge voltage and prevent the oscillation.

However, these prevention means cause the performance of the DMOS device to be decreased and the size thereof to be enlarged.

On the other hand, in order to improve the recovery characteristic of the body diode, there are well-known methods which use an electron beam irradiation process, a He-ray irradiation process and a heavy metal diffusion process, respectively, so as to reduce the lifetime of the n$^-$ epitaxial layer. However, because all of the methods make short the lifetime of the whole n$^-$ epitaxial layer, though it is possible to make faster the recovery characteristic, it is impossible to make soft it. That is, it is impossible to control the recovery serge of the body diode and prevent the oscillation thereof.

This reason is that, when the body diode is reversely recovered so that the di/dt of the reverse recovery current i equals to zero, that is, a voltage of power source of the device appears in the body diode, no carriers remain in an n$^-$ region under a depletion layer in the device.

Because, in the described methods for controlling the lifetime (the electron beam irradiation process, the He-ray irradiation process and the heavy metal diffusion process), the whole n$^-$ epitaxial layer has a short lifetime, it is hard to keep carriers in the n$^-$ region at the diode reverse recovery timing.

In order to solve the above problem, a cluster-containing layer containing a cluster of nitrogen, that is, the gettering layer described in the first and second embodiments is implanted in the DMOS device.

The cluster-containing layer allows to be shortened the lifetime of a region in which the cluster-containing layer exits in the n$^-$ epitaxial layer, and other regions in which no cluster-containing layer exists have a normal lifetime.

Therefore, when the body diode is subjected to the reverse recovery process, the carriers close to the base region 3 in the drift layer become extinct faster than other carriers far from the base region 3, making it possible to shorten the recovery time of the body diode.

Moreover, the other carriers are accumulated in the other regions in which no cluster-containing layer exists, permitting the serge voltage and the oscillation at the recovery timing to be controlled.

In addition to the above characteristics, this embodiment has a feature for obtaining the epitaxial layer having few crystal defects on the substrate on which the cluster-containing layer is formed.

Next, manufacturing processes of the MOSFET according to this embodiment will be explained hereinafter with reference to FIG. 17 to FIG. 19.

First, as shown in FIG. 17, the first epitaxial layer 41 in which phosphorus of $3 \times 10^{15}$ (cm$^{-3}$) is doped is formed on the CZ substrate 40 in which arsenic is doped so that the thickness of the first epitaxial layer 41 is substantially 6 μm in the depth direction of the substrate 40.

Nitrogen ions are implanted from an upper surface of the first epitaxial layer 41 thereinto and the substrate 40 with the first epitaxial layer 41 is subjected to a thermal process so that a cluster-containing layer 42 is formed, as a gettering layer, at a predetermined depth position.

The cluster-containing layer 42 is capable of controlling the lifetime of the first epitaxial layer 41. In detail, the nitrogen ions with doses of substantially $1 \times 10^{14}$ cm$^{-2}$ to $1 \times 10^{15}$ cm$^{-2}$ are implanted into the first epitaxial layer 41 by an energy of approximately 90 keV, and the substrate 40 with the first epitaxial layer 41 is subjected to thermal process for approximately one hour at approximately 1170° C.

These processes form the cluster-containing layer 42 in the first epitaxial layer 41 so that the concentration of the nitrogen atoms of the layer 42 has a concentration peak at a predetermined depth position at a distance of approximately 0.2~0.3 μm away from an upper surface (wafer surface) of the first epitaxial layer 41, thereby making short the lifetimes of holes (carriers) in the region in which the cluster-containing layer 42 is arranged.

At the time of the cluster-containing layer 42 being formed, defects 44 which are different from the cluster-containing layer 42 and biasedly extracted from the nitrogen atoms exist to be scattered in the vicinity of the wafer surface of the first epitaxial layer 41. The defects 44 exist only within a range of approximately 300 Å (angstroms) from the wafer surface.

When carrying out the vapor phase epitaxial growth on the first epitaxial layer 41 with the defects 44 on the first epitaxial layer 41 left, the existence of the defects 44 causes defects 45 in the epitaxial layer formed on the first epitaxial layer 41 by the epitaxial growth process.

Then, in this embodiment, the etching process is applied to the upper side of the first epitaxial layer 41 before forming the epitaxial layer 43, thereby removing the defects 44. This makes it possible to make the surface portion of the epitaxial layer 41, before forming the second epitaxial layer 43, into that having no defects, thereby making the second epitaxial layer 43 into a fine semiconductor layer having few crystal defects.

In a case of explaining the manufacturing processes in detail, after forming the cluster-containing layer 42 on the first epitaxial (silicon) layer 41, the wafer (the substrate 40 with the first epitaxial layer 41) is cleaned, and the silicon surface portion of the epitaxial layer 41, which is within the range of approximately 300 Å (angstroms) from the wafer surface (upper surface) thereof, is etched to be removed from the first epitaxial layer 41.

The first epitaxial layer 41 from which the silicon surface portion including the defects 44 is removed is subjected to a smoothing process of $H_2$ at a temperature of 1150° C. and, after the smoothing process, the epitaxial growth process of $H_2+SiH_4$ is applied to the first epitaxial layer 41 at a temperature of 1150° C. so that the second epitaxial layer 43 is formed on the first epitaxial layer 41.

As described above, removing a part of the epitaxial layer 41 which is positioned within the range from the upper surface (wafer surface), from which the nitrogen ions are implanted, of the first epitaxial layer 41 to the predetermined depth position t1 allows the epitaxial layer 41 having few crystal defects to be obtained.

Figure 13:
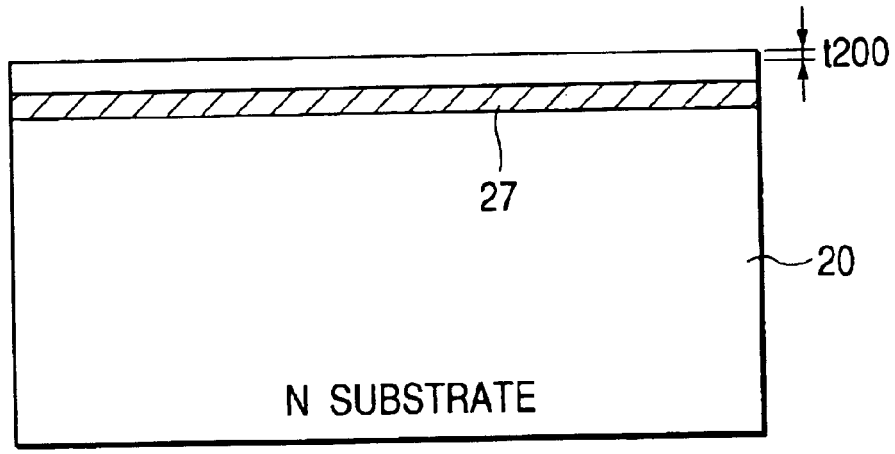
FIG. 13 is a vertical cross sectional view for explaining a manufacturing process of the n-channel vertical MOSFET according to the second embodiment of the present invention.

This removing process may be applied to the structure shown in FIG. 5 according to the first embodiment and/or to the structure shown in FIGS. 13 and 14 according to the second embodiment.

That is, after implanting the nitrogen ions into the semiconductor substrate 1 shown in FIG. 2, it may be possible to remove only a part of the semiconductor substrate 1, part which is positioned within the range from the upper surface of the semiconductor substrate 1 to the predetermined depth position t100 and may include the defects different from the cluster-containing layer 10, wherein the nitrogen ions are implanted from the upper surface of the substrate, as shown in FIG. 5.

Figure 20:
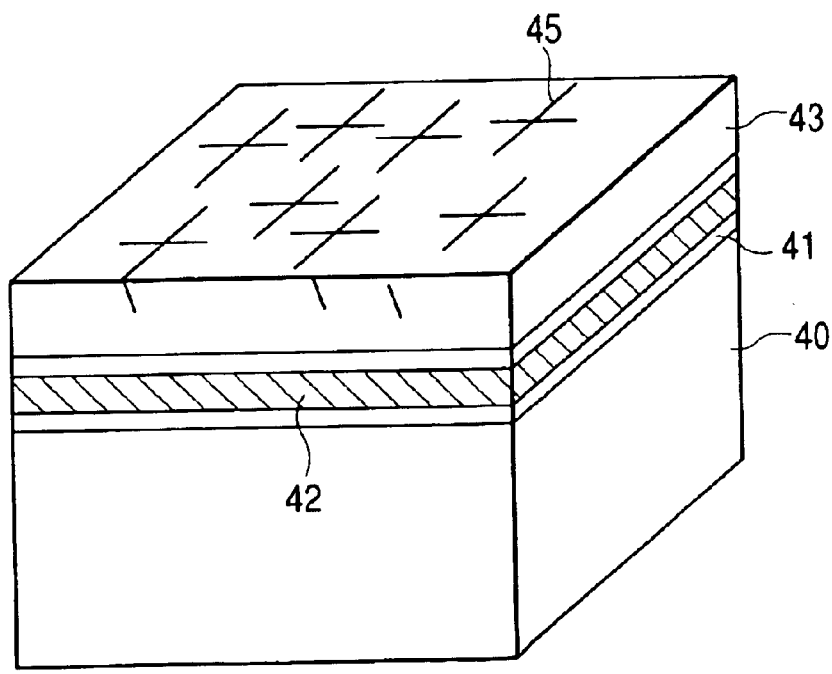
FIG. 20 is a perspective view for explaining a manufacturing process of an n-channel vertical MOSFET, which is compared with the n-channel vertical MOSFET according to the third embodiment.

Moreover, after implanting the nitrogen ions into the semiconductor substrate 20, it may be possible to remove only a part of the semiconductor substrate 20, part which is positioned within the range from the back surface of the semiconductor substrate 20 and may include the defects different from the cluster-containing layer 27, wherein the nitrogen ions are implanted to the predetermined depth position t200, as shown in FIG. 20.

(Fourth Embodiment)

Next, a fourth embodiment of the present invention will be explained hereinafter with a focus on the different points of this embodiment from the first embodiment so that the expressions of the elements of the fourth embodiment which are the same as those of the first embodiment are omitted or simplified.

Manufacturing processes of the MOSFET according to this embodiment will be explained hereinafter with reference to FIG. 21 to FIG. 24. In this embodiment, a semiconductor substrate comprises a first semiconductor substrate (silicon substrate) 50, an insulating film 51 formed thereon and a second semiconductor substrate (silicon substrate) 53 formed on the insulating film 51.

Figure 21:
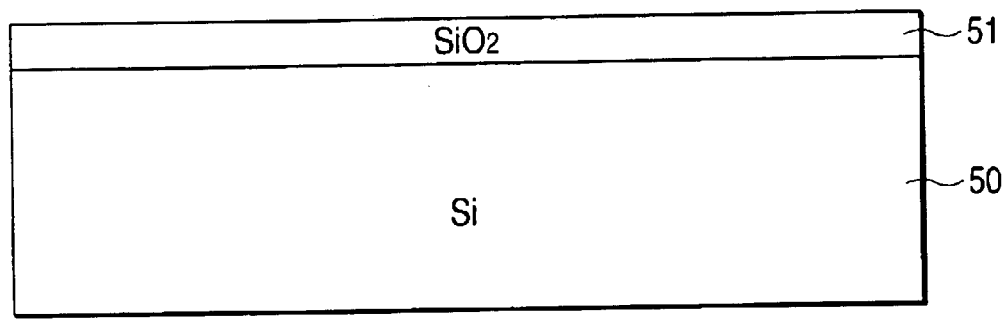
FIG. 21 is a vertical cross sectional view for explaining a manufacturing process of an n-channel vertical MOSFET according to a fourth embodiment of the present invention.
Figure 22:
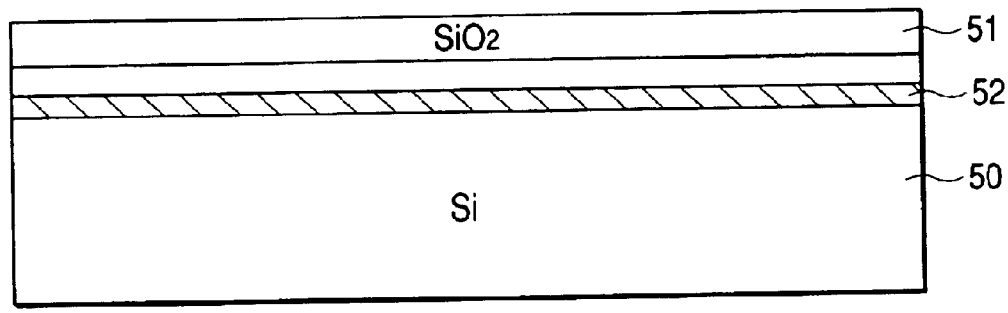
FIG. 22 is a vertical cross sectional view for explaining a manufacturing process of the n-channel vertical MOSFET according to the fourth embodiment of the present invention.

First, as shown in FIG. 21, a silicon oxide as the insulating film 51 is formed on the first silicon substrate 50. Next, as shown in FIG. 22, nitrogen ions are implanted from an upper surface of the silicon oxide 51 thereinto. That is, the nitrogen ions with doses of substantially $1\times10^{16}$ cm$^{-2}$ are implanted through the silicon oxide 51 into the first silicon substrate 50 by an energy of approximately 90 keV.

Further, the first silicon substrate 50 with the silicon oxide 51 is subjected to anneal process for approximately one hour at approximately 1150° C., so that a cluster-containing layer 52 containing a cluster of nitrogen is formed, as a gettering layer, at a predetermined depth position from an upper surface of the first silicon substrate 50.

Figure 23:
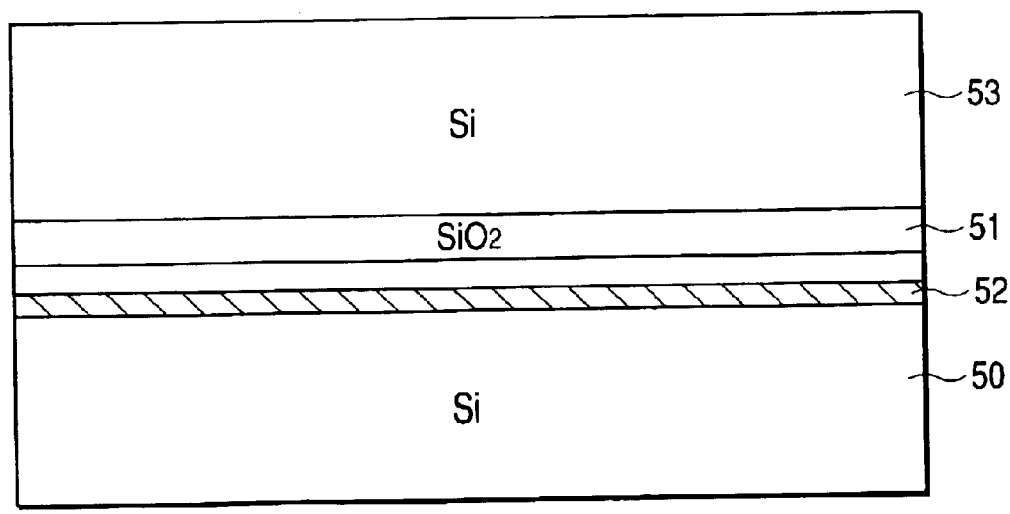
FIG. 23 is a vertical cross sectional view for explaining a manufacturing process of the n-channel vertical MOSFET according to the fourth embodiment of the present invention.

After the forming process, as shown in FIG. 23, the second silicon substrate 53 is bonded (laminated) through the silicon oxide 51 on the first silicon substrate 50.

Figure 24:
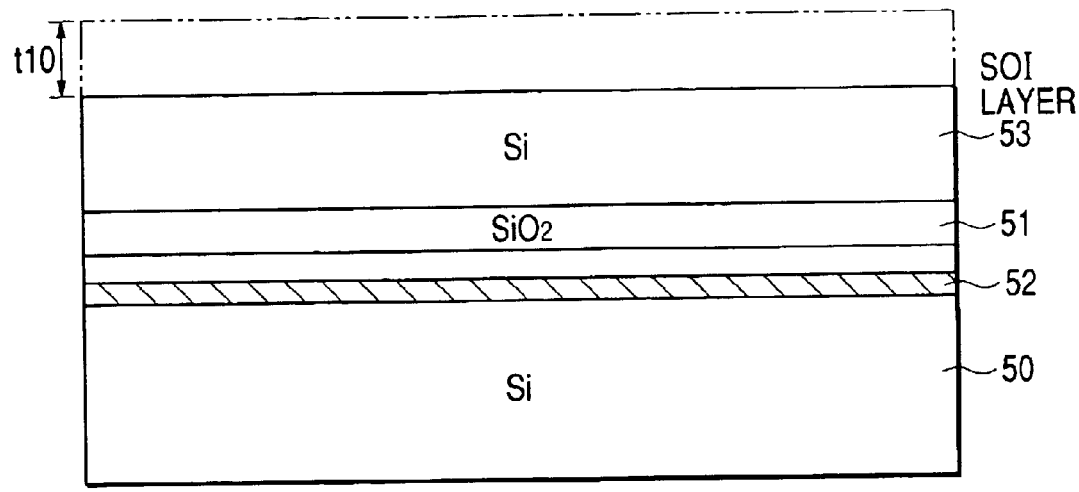
FIG. 24 is a vertical cross sectional view for explaining a manufacturing process of the n-channel vertical MOSFET according to the fourth embodiment of the present invention.

While the second silicon substrate 53 is laminated on the first silicon substrate 50, which is shown in FIG. 23, an upper portion of the second silicon substrate 53 is polished in the range from an upper surface thereof to a predetermined length t10 in the depth direction, as shown in FIG. 24, thereby making the thickness of the second silicon substrate 53 to a desired thickness in the depth direction.

Elements (devices) are formed on the second silicon substrate 53 which is made thin, that is, SOI (Silicon On Insulator) layer 53. In this case, the cluster-containing layer (gettering layer) 52 is formed under the silicon oxide 51 which is lower side of the SOI layer 53.

Figure 25:
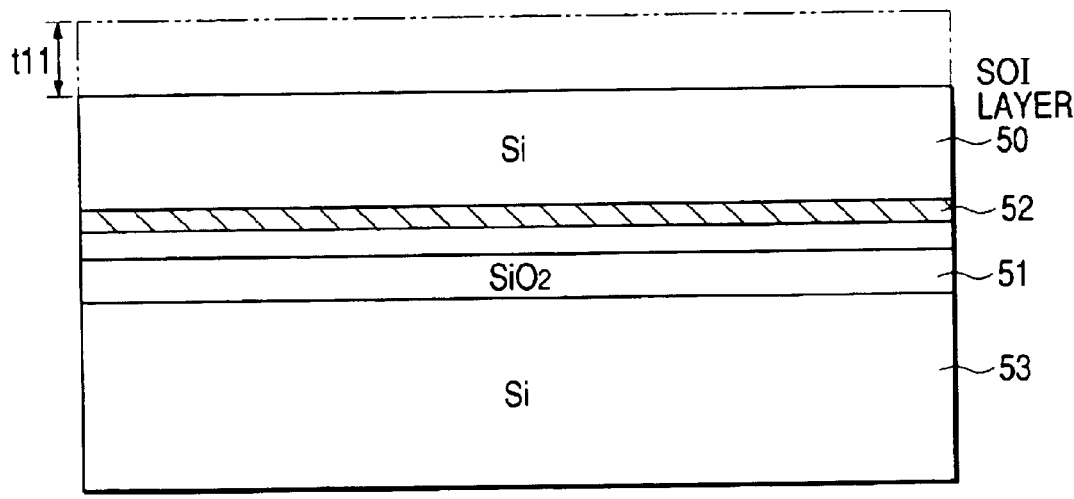
FIG. 25 is a vertical cross sectional view for explaining a manufacturing process of the n-channel vertical MOSFET according to the fourth embodiment of the present invention.

As other method of manufacturing the semiconductor device with the structure according to this embodiment, in a state of FIG. 23, the wafer consisting of the first silicon substrate 50 including the cluster-containing layer 52, the silicon oxide 51 and the second silicon substrate 53 may be inverted so that, as shown in FIG. 25, an upper portion of the first silicon substrate 50 is polished in the range from an upper surface thereof to a predetermined length t11 in the depth direction, thereby making the thickness of the first silicon substrate 50 to a desired thickness in the depth direction. The elements (devices) may be formed on the first silicon substrate 50 (SOI layer) which is made thin.

In this case, the cluster-containing layer (gettering layer) 52 is implanted in a bottom region of the SOI layer 50, which gives no influence to the characteristics of the elements.

Figure 26:
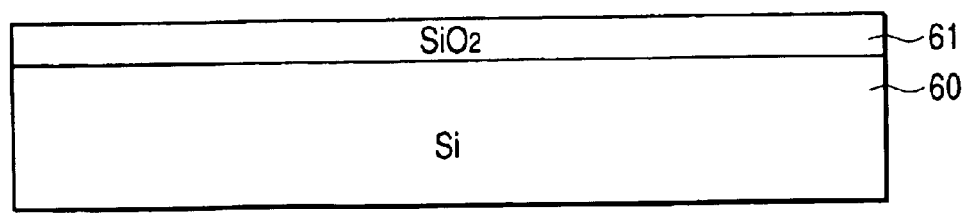
FIG. 26 is a vertical cross sectional view of an n-channel vertical MOSFET.
Figure 27:
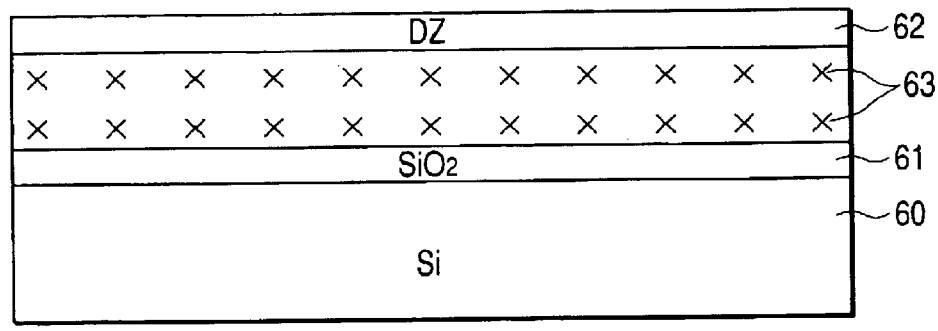
FIG. 27 is a view for explaining a manufacturing process of a semiconductor device according to the fourth embodiment.
Figure 28:
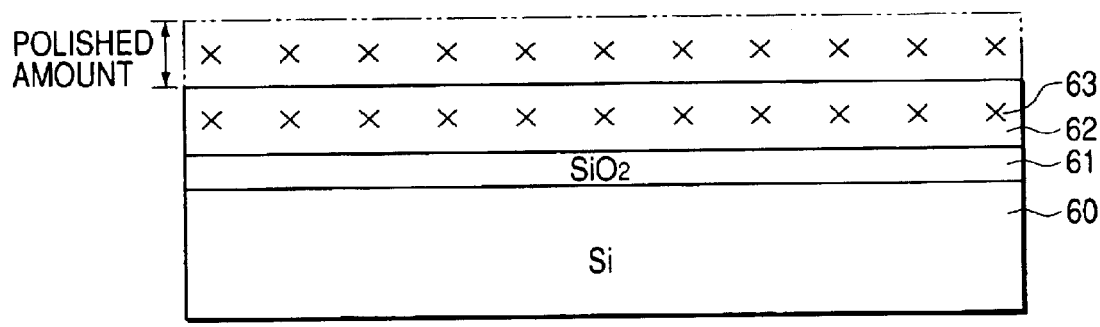
FIG. 28 is a view for explaining a manufacturing process of a semiconductor device according to the fourth embodiment.

As compared to the related art with respect to this embodiment, in the related art, as shown in FIG. 26, a first silicon oxide 61 is formed on a silicon substrate 60 with its thickness of approximately 0.5~1 μm. Next, as shown in FIG. 27, a second silicon substrate 62 is bonded (laminated) on the silicon oxide 61. After the laminating process, as shown in FIG. 28, the second silicon substrate 62 is polished so that its thickness in the depth direction is set to a desired thickness of approximately 0.5 µm~50 µm therein.

In the related art, when forming an oxygen precipitate layer 63 in the second silicon substrate 62 by, for example, thermal process, the oxygen precipitate layer 63 is formed at a predetermined depth position of approximately 10~50 µm or over away from an upper surface (silicon surface) of the second silicon substrate 62 so that a denuded zone DZ which is a defect-free zone is formed between the silicon surface and the oxygen precipitate layer 63, as shown in FIG. 27.

Therefore, when polishing the upper portion of the second silicon substrate 62 so as to set its thickness to a desired one, crystal defects appear in the second silicon substrate (SOI layer) 62.

Figure 29:
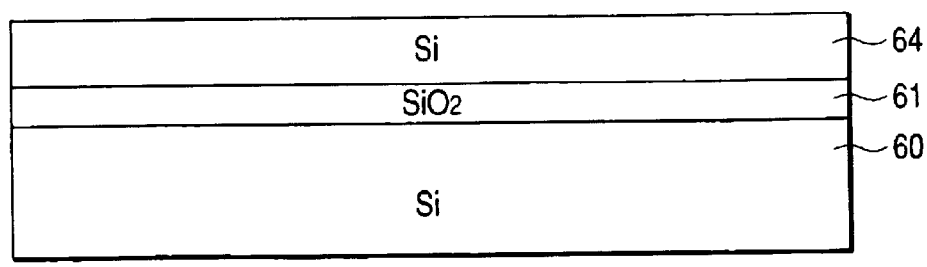
FIG. 29 is a view for explaining a manufacturing process of a semiconductor device according to the fourth embodiment.
Figure 30:
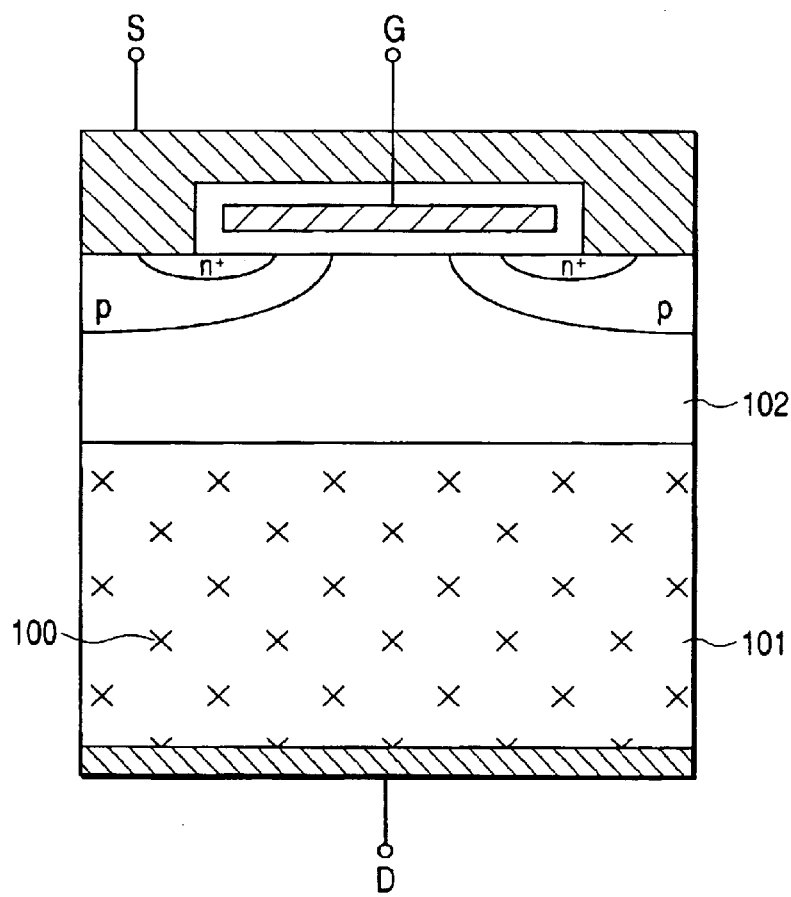
FIG. 30 is a vertical cross sectional view of a conventional n-channel vertical MOSFET.
Figure 31:
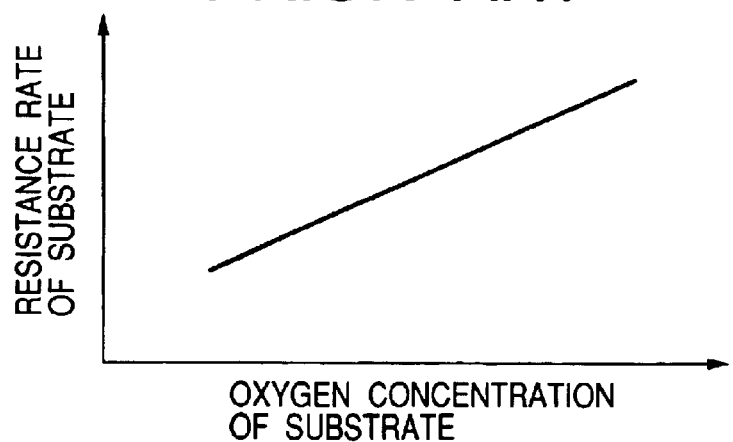
FIG. 31 is a view showing a correlation between the resistance rate of the conventional n-channel vertical MOSFET and the oxygen concentration thereof.

In order to avoid the appearance of the crystal defects in the SOI layer 62, when laminating a second silicon substrate 64 having no oxygen precipitate layer on the silicon oxide 61 without thermal process, the wafer consisting of the first silicon substrate 60, the silicon oxide 61 and the SOI layer 64 is formed without having the oxygen precipitate layer 63 (gettering layer, as shown in FIG. 29.

Because the gettering layer is not formed in the wafer, the crystal defects enter into the SOI layer due to thermal process, contamination of heavy metal and so on so that the SOI layer is affected to external disturbance.

On the contrary, in the embodiment shown in FIG. 21 to FIG. 25, using the implantation of the nitrogen ions allows the gettering layer 52 to be precisely formed at a desired position, thereby making the element formation region of the SOI layer to denuded zone.

As described above, the precisely formation of the gettering layer at the desired position permits the element formation region of the SOI layer to turn the denuded zone, making it possible to improve the performance of the semiconductor device.

In addition, the doses of the nitrogen atoms according to the fourth embodiment, when executing the ion implanting process shown in FIG. 22, may be set to those thereof according to this embodiment, which are within the range from substantially $1 \times 10^{14}$ cm$^{-2}$ to substantially $1 \times 10^{15}$ cm$^{-2}$.

In each embodiment, the present invention is applied to the vertical semiconductor device, but the present invention is not limited to the application. The present invention may be applied to lateral semiconductor devices.

In each embodiment, the present invention is applied to the single crystal semiconductor device, but the present invention is not limited to the application. The present invention may be applied to polycrystalline semiconductor devices.

The above test results of the samples in the first and second embodiments are within the scope of the present invention. They are, of course, not to be considered in any way limitative of the present invention.

While there has been described what is at present considered to be the preferred embodiments and modifications of the present invention, it will be understood that various modifications which are not described yet may be made therein, and it is intended to cover in the appended claims all such modifications as fall within the true spirit and scope of the invention.

What is claimed is:

1. A semiconductor device comprising:

a heavily doped semiconductor layer;

a lightly doped semiconductor layer located on the heavily doped semiconductor layer;

a vertical-type MOS element formed at a surface portion of the lightly doped semiconductor layer; and a cluster-containing layer containing a cluster of nitrogen, said cluster-containing layer being disposed in the heavily doped semiconductor layer.

2. The semiconductor device according to claim 1, wherein said cluster of nitrogen corresponds to doses of nitrogen ions, said doses of nitrogen ions being more than $1 \times 10^{15}$ cm$^{-2}$.

3. A semiconductor device according to claim 1, wherein said depth of the cluster-containing layer is sufficient to reduce a number of defects in the surface portion without substantially affecting a characteristic of the vertical-type MOS element of said surface portion.

4. A semiconductor device according to claim 1, wherein said cluster-containing layer spreads throughout in a direction substantially perpendicular to a depth direction of the lightly doped semiconductor layer.

5. A semiconductor device according to claim 1, wherein said cluster-containing layer has a concentration profile $T_p$ whose half width $T_{p/2}$ is approximately 10 µm in a depth direction of the heavily doped semiconductor layer and is locally arranged in the depth direction.

6. A semiconductor device comprising:

a heavily doped semiconductor layer;

a lightly doped semiconductor layer located on the heavily doped semiconductor layer;

a vertical-type MOS element formed at a surface portion of the lightly doped semiconductor layer; and a cluster-containing layer containing a cluster of nitrogen, wherein said cluster-containing layer is disposed in the lightly doped semiconductor layer at a depth deeper than said surface portion, and is configured to remove a defect existing in at least the surface portion of the lightly doped semiconductor layer.

7. The semiconductor device according to claim 6, wherein said cluster of nitrogen corresponds to doses of nitrogen ions, said doses of nitrogen ions being more than $1 \times 10^{15}$ cm$^{-2}$.

8. A semiconductor device according to claim 6, wherein said depth of the cluster-containing layer is sufficient to reduce a number of defects in the surface portion without substantially affecting a characteristic of the vertical-type MOS element of the surface portion.

9. A semiconductor device according to claim 6, wherein said cluster-containing layer spreads throughout in a direction substantially perpendicular to a depth direction of the lightly doped semiconductor layer.

10. A semiconductor device according to claim 6, wherein said cluster-containing layer has a concentration profile $T_p$ whose half width $T_p/2$ is approximately 10 µm in a depth direction of the heavily doped semiconductor layer and is locally arranged in the depth direction.

* * * * *

UNITED STATES PATENT AND TRADEMARK OFFICE
CERTIFICATE OF CORRECTION

PATENT NO. : 6,946,711 B2  
APPLICATION NO. : 10/164314  
DATED : September 20, 2005  
INVENTOR(S) : Mikimasa Suzuki et al.

It is certified that error appears in the above-identified patent and that said Letters Patent is hereby corrected as shown below:

<u>Title page, Item [54] and Column 1, line 1,</u>  
Title, should read -- SEMICONDUCTOR DEVICE AND METHOD OF MANUFACTURING THE SAME --.

Signed and Sealed this

Twenty-seventh Day of June, 2006

JON W. DUDAS  
*Director of the United States Patent and Trademark Office*